(12) United States Patent
Kim et al.

(10) Patent No.: US 9,865,818 B2
(45) Date of Patent: Jan. 9, 2018

(54) METHOD FOR SYNTHESIZING A HALOGEN-FUNCTIONALIZED CARBON MATERIAL AND METHOD FOR FABRICATING AN ELECTRONIC DEVICE EMPLOYING THE SAME

(71) Applicant: Industry-Academic Cooperation Foundation, Yonsei University, Seoul (KR)

(72) Inventors: Hyungjun Kim, Seoul (KR); Tae Jin Choi, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 9 days.

(21) Appl. No.: 14/683,050

(22) Filed: Apr. 9, 2015

(65) Prior Publication Data

US 2015/0294907 A1   Oct. 15, 2015

(30) Foreign Application Priority Data

Apr. 9, 2014 (KR) ........................ 10-2014-0042427

(51) Int. Cl.
*H01L 51/00* (2006.01)
*H01L 21/768* (2006.01)
(Continued)

(52) U.S. Cl.
CPC ........ *H01L 51/0045* (2013.01); *C01B 32/186* (2017.08); *H01L 51/0558* (2013.01)

(58) Field of Classification Search
CPC ............... H01L 21/768; H01L 23/3164; H01L 29/1054; H01L 51/0045
(Continued)

(56) References Cited

U.S. PATENT DOCUMENTS 8,114,373 B2    2/2012  Jang et al.
2011/0190435 A1  8/2011  Jang et al.
(Continued)

FOREIGN PATENT DOCUMENTS

JP    09-022696    1/1997
JP    2006232565   9/2006
(Continued)

OTHER PUBLICATIONS

Notice of Allowance for KR App No. 10-2014-0042427 dated Aug. 28, 2015, 7 pgs.
Diacon, A., et al., Superficial Grafting of Water-Soluble Polymers on Brominated MWCNT by ATRP Technique, International Journal of Polymer Analysis and Characterization, 2011, 16:1, 10 pgs.
Fanchini, G., et al., Modification of Transparent and Conducting Single Wall Carbon Nanotube Thin Films via Bromine Functionalization, Applied Physics Letters, 2007, 90, 4 pgs.
(Continued)

*Primary Examiner* — Moazzam Hossain
*Assistant Examiner* — Omar Mojaddedi
(74) *Attorney, Agent, or Firm* — Procopio, Cory, Hargreaves & Savitch LLP

(57) ABSTRACT

Provided are methods for synthesizing a halogen-functionalized carbon material and for fabricating an electronic device employing the same. The synthesizing method of the halogen-functionalized carbon material may include thermally treating a transition metal material at a first temperature in a hydrogen atmosphere and thermally treating the transition metal material at a second temperature, which is lower than or equal to the first temperature, while further supplying halocarbon on the transition metal material.

20 Claims, 12 Drawing Sheets

(51) Int. Cl.
  *G01N 33/00* (2006.01)
  *H01L 29/41* (2006.01)
  *C01B 32/186* (2017.01)
  *H01L 51/05* (2006.01)

(58) Field of Classification Search
  USPC .......................................................... 438/610
  See application file for complete search history.

(56) References Cited

U.S. PATENT DOCUMENTS

| | | | |
|---|---|---|---|
| 2012/0301816 A1* | 11/2012 | Lee .................. | H01M 4/96 429/523 |
| 2013/0171452 A1* | 7/2013 | Goela ............... | H01B 1/06 428/408 |
| 2014/0239256 A1* | 8/2014 | Kim .................. | H01L 21/0262 257/29 |
| 2015/0136737 A1* | 5/2015 | Loh .................. | B82Y 30/00 216/100 |

FOREIGN PATENT DOCUMENTS

| KR | 10-1999-0059188 | 7/1999 |
|---|---|---|
| KR | 10-2008-0022735 | 3/2008 |
| KR | 10-2009-0124230 | 12/2009 |
| KR | 1020110056869 | 5/2011 |
| KR | 1020120018683 | 5/2012 |

OTHER PUBLICATIONS

Friedrich, J.F., et al., Plasma-Chemical Bromination of Graphitic Materials and its Use for Subsequent Functionalization and Grafting of Organic Molecules, Carbon, 2010, 48, pp. 3384-3894.

Gopalakrishnan, K., et al., Reversible Chemical Storage of Halogens in Few-Layer Graphene, RSC Advances, 2012, 2, pp. 1605-1608.

Karlicky, F., et al., Halogenated Graphenes: Rapidly Growing Family of Graphene Derivatives, ACS Nano, 2013, 7(8), pp. 6434-6464.

Mazov, I., et al., Direct Vapor-Phase Bromination of Multiwall Carbon Nanotubes, Journal of Nanotechnology, 2012, 2012, 5 pgs.

Saito, R., et al, Chemical Reaction of Intercalated Atoms at the Edge of Nano-Graphene Cluster, Molecular Crystals and Liquid Crystals Science and Technology, 2000, 340, pp. 71-76.

Unger, E., Electrochemical Functionalization of Multi-Walled Carbon Nanotubes for Solvation and Purification, Current Applied Physics, 2002, 2, pp. 107-111.

Volodina, V.A., et al., Direct and Initiated Halogenation of Carbon Nanomaterials at Low Temperatures, High Energy Chemistry, 2008, 42(4), pp. 311-318.

Wheeler, V., et al., Fluorine Functionalization of Epitaxial Graphene for Uniform Deposition of Thin High-k Dielectrics, Carbon, 2012, 50, pp. 2307-2314.

* cited by examiner

METHOD FOR SYNTHESIZING A HALOGEN-FUNCTIONALIZED CARBON MATERIAL AND METHOD FOR FABRICATING AN ELECTRONIC DEVICE EMPLOYING THE SAME

CROSS-REFERENCE TO RELATED APPLICATIONS

This U.S. non-provisional patent application claims priority under 35 U.S.C. §119 to Korean Patent Application No. 10-2014-0042427, filed on Apr. 9, 2014, in the Korean Intellectual Property Office, the entire contents of which are hereby incorporated by reference.

BACKGROUND OF THE INVENTION

Example embodiments of the inventive concept relates to a method for synthesizing a halogen-functionalized carbon material and a method for fabricating an electronic device employing the same.

Due to their excellent properties of high electric conductivity, high strength, and high thermal conductivity, carbon materials such as graphene and carbon nanotube are emerging as new material applicable to various industrial fields, such as battery or sensor.

By depositing another material on a surface of the carbon material or doping the carbon material with a functional group, it is possible to change material properties of the carbon material. In particular, a binding force between halocarbon functional groups, such as fluorine, chlorine, and bromine, and carbon is weaker than that between an oxygen or nitrogen functional group and carbon, and thus, a secondary functionalization thereon can be more easily achieved.

A conventional method of synthesizing the halogen-functionalized carbon material may include two steps of synthesizing a carbon material and functionalizing the carbon material with a halogen material. In other words, for the conventional halogen-functionalized carbon material, it is necessary to perform an additional functionalizing process, after the synthesizing of the carbon material, and this leads to an increase in turn-around-time of the process and a reduction in productivity of the process.

SUMMARY

Example embodiments of the inventive concept provide a method of synthesizing a halogen-functionalized carbon material through a single process and a method for fabricating an electronic device employing the same.

Example embodiments of the inventive concept provide a method of changing material properties a halogen-functionalized carbon material by changing a process condition, when the halogen-functionalized carbon material is synthesized, and a method for fabricating an electronic device employing the same.

According to example embodiments of the inventive concept, a method for synthesizing a halogen-functionalized carbon material may include thermally treating a transition metal material at a first temperature in a hydrogen atmosphere and thermally treating the transition metal material at a second temperature, which is lower than or equal to the first temperature, while further supplying halocarbon on the transition metal material.

In example embodiments, the transition metal material may be formed of at least one metallic material selected from the group consisting of copper, nickel, gold, iron, cobalt, platinum, ruthenium, iridium, rhodium, and palladium.

In example embodiments, the transition metal material may be a thin film having a thickness ranging from 500 nm to 70 μm.

In example embodiments, during the steps of thermally treating the transition metal material at the first and second temperatures, a chamber, in which the transition metal material is loaded, may be maintained to a pressure lower than the atmospheric pressure.

In example embodiments, an inner pressure of the chamber may range from 1 Torr to 100 Torr.

In example embodiments, an inner pressure of the chamber may be maintained to 3.5 Torr.

In example embodiments, the thermal treating of the transition metal material at the first temperature in the hydrogen atmosphere may include supplying a hydrogen gas and an inert gas onto the transition metal material.

In example embodiments, a supply amount of the hydrogen gas may be less than or equal to that of the inert gas.

In example embodiments, a ratio in volume of the hydrogen gas to the inert gas may range from 1:1 to 1:10.

In example embodiments, a ratio in volume of the hydrogen gas to the inert gas may be 1:5.

In example embodiments, the thermal treating of the transition metal material at the first temperature in the hydrogen atmosphere may include thermally treating the transition metal material to allow a surface of the transition metal material to have fluidity or liquidity.

In example embodiments, the thermal treating of the transition metal material at the first temperature in the hydrogen atmosphere may include thermally treating the transition metal material at a temperature ranging from 1000° C. to 1080° C.

In example embodiments, the thermal treating of the transition metal material at the first temperature in the hydrogen atmosphere may include thermally treating the transition metal material for a process time ranging from 1 hour to 2 hours.

In example embodiments, the thermal treating of the transition metal material at the second temperature while further supplying halocarbon on the transition metal material may include thermally treating the transition metal material at a temperature ranging from 400° C. to 1000° C.

In example embodiments, the thermal treating of the transition metal material at the second temperature while further supplying halocarbon on the transition metal material may include thermally treating the transition metal material for 15 seconds to 2 minutes.

In example embodiments, the thermal treating of the transition metal material at the second temperature while further supplying halocarbon on the transition metal material may include supplying the halocarbon on the transition metal material at a partial pressure of 1 mTorr to 20 mTorr.

In example embodiments, the halocarbon may include at least one of carbon tetrafluoride ($CF_4$), carbon tetrachloride ($CCl_4$), or carbon tetrabromide ($CBr_4$).

In example embodiments, the method may further include cooling the transition metal material in an inert atmosphere, after the thermal treating of the transition metal material at the second temperature while further supplying halocarbon on the transition metal material.

According to example embodiments of the inventive concept, a method of fabricating an electronic device may include thermally treating a transition metal material at a first temperature in a hydrogen atmosphere, thermally treating the transition metal material at a second temperature, which is lower than or equal to the first temperature, while further supplying halocarbon on the transition metal material to grow a halogen-functionalized carbon layer on the transition metal material, removing the transition metal material from the halogen-functionalized carbon layer, transferring the halogen-functionalized carbon layer on a substrate, and forming an electrode on the halogen-functionalized carbon layer.

In example embodiments, the transition metal material may be formed of at least one metallic material selected from the group consisting of copper, nickel, gold, iron, cobalt, platinum, ruthenium, iridium, rhodium, and palladium.

In example embodiments, the transition metal material may be a thin film having a thickness ranging from 500 nm to 70 μm.

In example embodiments, during the steps of thermally treating the transition metal material at the first temperature and growing the halogen-functionalized carbon layer, a chamber, in which the transition metal material is loaded, may be maintained to a pressure lower than the atmospheric pressure.

In example embodiments, an inner pressure of the chamber may range from 1 Torr to 100 Torr.

In example embodiments, an inner pressure of the chamber may be maintained to 3.5 Torr.

In example embodiments, the thermal treating of the transition metal material at the first temperature in the hydrogen atmosphere may include supplying a hydrogen gas and an inert gas onto the transition metal material.

In example embodiments, a supplying amount of the hydrogen gas may be smaller than or equal to that of the inert gas.

In example embodiments, a ratio in volume of the hydrogen gas to the inert gas may range from 1:1 to 1:10.

In example embodiments, a ratio in volume of the hydrogen gas to the inert gas may be 1:5.

In example embodiments, the thermal treating of the transition metal material at the first temperature in the hydrogen atmosphere may include thermally treating the transition metal material to allow a surface of the transition metal material to have fluidity or liquidity.

In example embodiments, the thermal treating of the transition metal material at the first temperature in the hydrogen atmosphere may include thermally treating the transition metal material at a temperature ranging from 1000° C. to 1080° C.

In example embodiments, the thermal treating of the transition metal material at the first temperature in the hydrogen atmosphere may include thermally treating the transition metal material for a process time ranging from 1 hour to 2 hours.

In example embodiments, the forming of the halogen-functionalized carbon layer on the transition metal material may include thermally treating the transition metal material at a temperature ranging from 400° C. to 1000° C.

In example embodiments, the forming of the halogen-functionalized carbon layer on the transition metal material may include thermally treating the transition metal material for 15 seconds to 2 minutes.

In example embodiments, the forming of the halogen-functionalized carbon layer on the transition metal material may include supplying the halocarbon on the transition metal material at a partial pressure of 1 mTorr to 20 mTorr.

In example embodiments, the halocarbon may include at least one of carbon tetrafluoride ($CF_4$), carbon tetrachloride ($CCl_4$), or carbon tetrabromide ($CBr_4$).

In example embodiments, the method may further include cooling the transition metal material in an inert atmosphere, after growing the halogen-functionalized carbon layer on the transition metal material.

In example embodiments, the removing of the transition metal material from the halogen-functionalized carbon layer may include etching the transition metal material, on which the halogen-functionalized carbon layer is grown.

In example embodiments, the transferring of the halogen-functionalized carbon layer on the substrate may include disposing the halogen-functionalized carbon layer, from which the transition metal material is removed, on the substrate.

In example embodiments, the substrate may include a gate and an insulating layer formed on the gate.

In example embodiments, the forming of the electrode on the halogen-functionalized carbon layer may include forming source and drain electrodes on both edges of the halogen-functionalized carbon layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
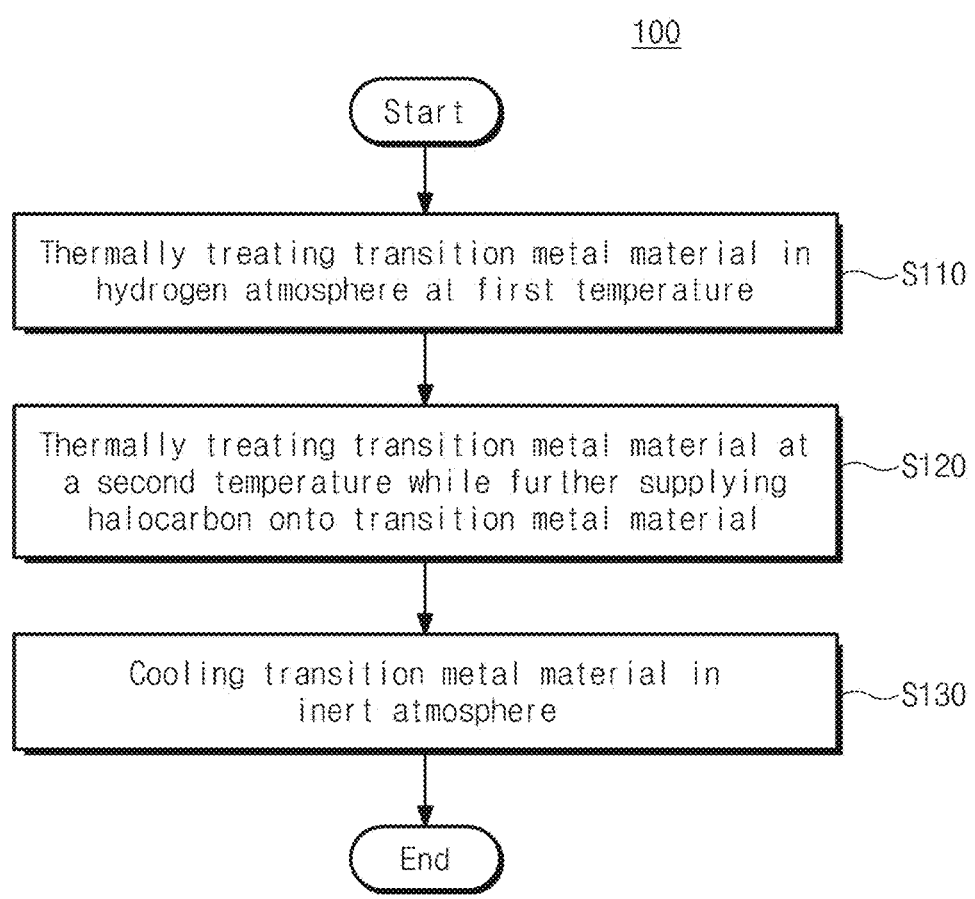
FIG. 1 is a flow chart exemplarily illustrating a method for synthesizing a halogen-functionalized carbon material, according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a flow chart exemplarily illustrating a method for synthesizing a halogen-functionalized carbon material 100, according to example embodiments of the inventive concept.

As shown in FIG. 1, the method for synthesizing a halogen-functionalized carbon material 100 may include a step S110 of thermally treating a transition metal material in a hydrogen atmosphere at a first temperature and a step S120 of thermally treating the transition metal material at a second temperature equal to or lower than the first temperature while supplying halocarbon onto the transition metal material.

The transition metal material may be composed of at least one of transition metals (e.g., elements in groups 3 through 12 of the periodic table) and may be used as catalysts in a process of growing a halogen-functionalized carbon material.

In example embodiments, the transition metal material may be composed of one or more metallic elements selected from the group consisting of copper, nickel, gold, iron, cobalt, platinum, ruthenium, iridium, rhodium, and palladium, but example embodiments of the inventive concepts may not be limited thereto.

Figure 2:
FIG. 2 is a sectional view exemplarily illustrating a transition metal material according to example embodiments of the inventive concept.

FIG. 2 is a sectional view exemplarily illustrating a transition metal material 200, according to example embodiments of the inventive concept.

As shown in FIG. 2, the transition metal material 200 may be a foil of transition metal. In example embodiments, the foil may have a thickness d ranging from 500 nm to 70 μm, but example embodiments of the inventive concepts may not be limited thereto.

Further, the shape of the transition metal material 200 is not limited to the foil. For example, the transition metal material 200 may be a thin-film formed by sputtering or depositing a transition metal on a substrate.

Figure 3:
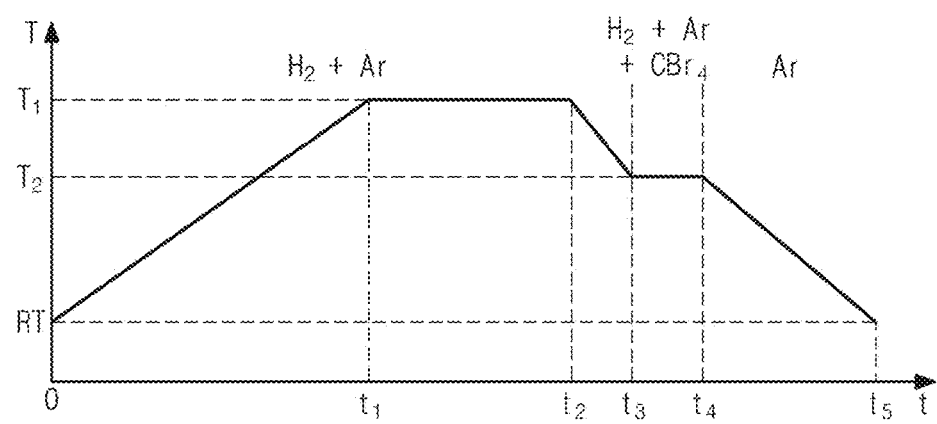
FIG. 3 is a graph showing the change in temperature over time of a process of synthesizing a halogen-functionalized carbon material, according to example embodiments of the inventive concept.

FIG. 3 is a graph showing the change in temperature over time of a process of synthesizing a halogen-functionalized carbon material, according to example embodiments of the inventive concept.

Referring to FIG. 3, according to the synthesizing method 100, in a hydrogen atmosphere, the transition metal material 200 may be heated up to a first temperature $T_1$, and then, the process temperature may be maintained at the first temperature $T_1$ during a period of $t_2$-$t_1$.

Thereafter, the process temperature of the thermal treatment process may be decreased to a second temperature $T_2$, which is equal to or lower than the first temperature $T_1$, during a period of $t_3$-$t_2$, and may be maintained at the second temperature $T_2$ during a period of $t_4$-$t_3$ while halocarbon is additionally supplied onto the transition metal material 200, thereby synthesizing a halogen-functionalized carbon material.

In example embodiments, internal pressure of a chamber provided with the transition metal material 200 may be maintained lower than the atmospheric pressure, during the step S110 of performing the thermal treatment at the first temperature $T_1$ and the step S120 of performing the thermal treatment at the second temperature $T_2$. In other words, the thermal treatment process according to example embodiments of the inventive concept may be performed at pressure lower than the atmospheric pressure.

For example, the internal pressure of the chamber may be maintained within a range from 1 Torr to 100 Torr, preferably, to about 3.5 Torr, but example embodiments of the inventive concepts may not be limited thereto.

Figure 4:
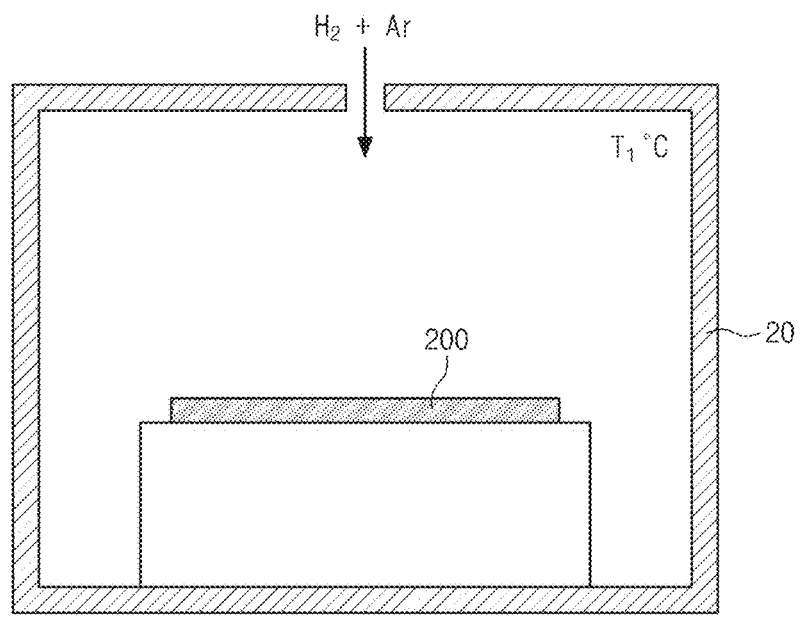
FIGS. 4 through 6 are schematic diagrams exemplarily illustrating a process of synthesizing a halogen-functionalized carbon material, according to example embodiments of the inventive concept.
Figure 5:
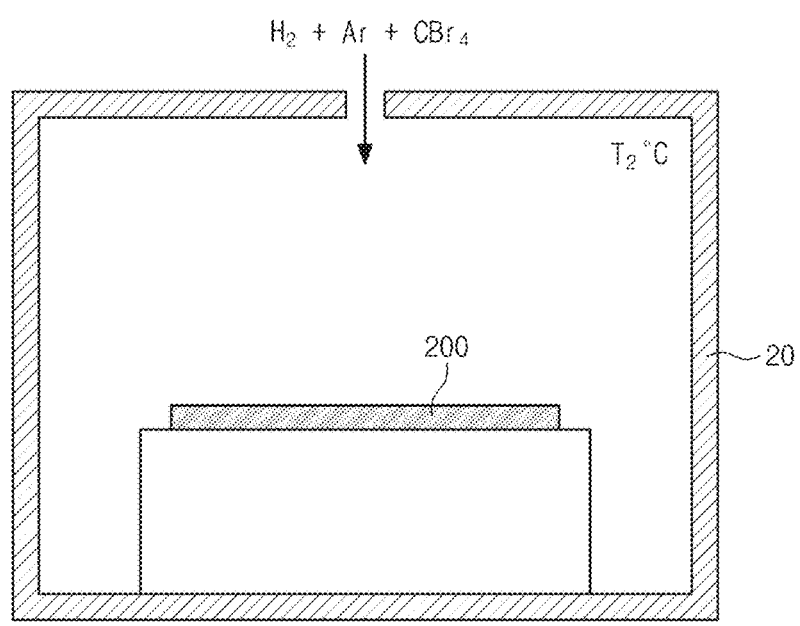
Figure 6:
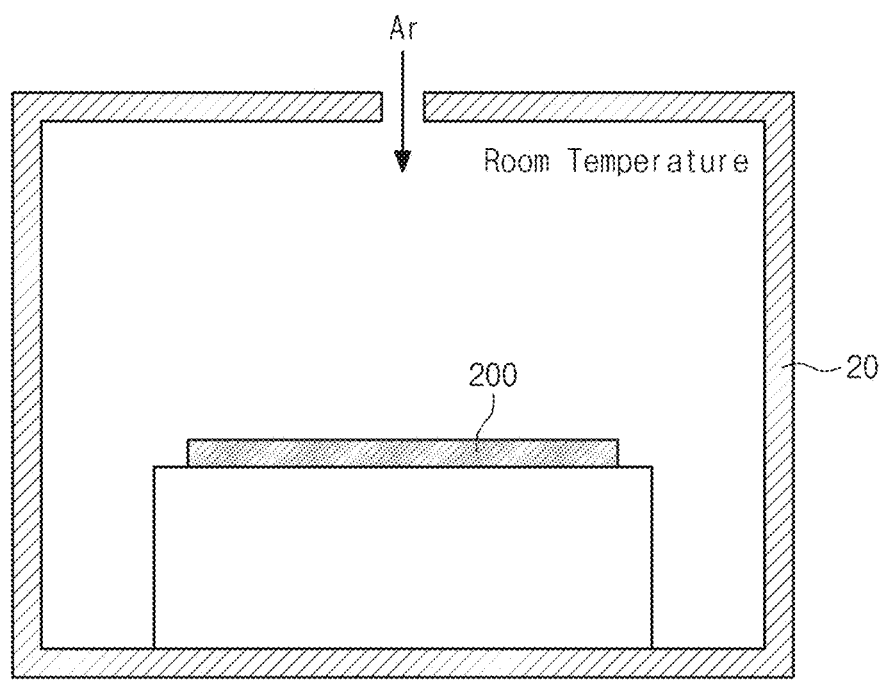

FIGS. 4 through 6 are schematic diagrams exemplarily illustrating a process of synthesizing a halogen-functionalized carbon material, according to example embodiments of the inventive concept.

In example embodiments, the step S110 of performing the thermal treatment on the transition metal material 200 at the first temperature $T_1$ in the hydrogen atmosphere may include a step of supplying a hydrogen gas and an inert gas onto the transition metal material 200.

Referring to FIG. 4, to synthesize the halogen-functionalized carbon material, the transition metal material 200 may be loaded in a chamber 20, and next, a thermal treatment may be performed on the chamber 20 at the first temperature $T_1$ while the hydrogen gas and the inert gas are supplied into the chamber 20.

Argon (Ar) may be used as the inert gas, as shown in FIG. 4, but example embodiments of the inventive concepts may not be limited thereto.

In example embodiments, a supplying amount of the hydrogen gas may be smaller than or equal to that of the inert gas.

For example, a ratio in volume of the hydrogen gas to the inert gas, which are supplied into the chamber 20, may range from 1:1 to 1:10 (in particular, about 1:5). As an example, the hydrogen gas may be supplied at a flow rate of 200 sccm and the inert gas may be supplied at a flow rate of 1000 sccm, but example embodiments of the inventive concepts may not be limited thereto.

In example embodiments, the step S110 of performing the thermal treatment on the transition metal material 200 at the first temperature T1 in the hydrogen atmosphere may include a step of performing a thermal treatment on the transition metal material 200 to allow a surface of the transition metal material 200 to have fluidity or liquidity.

For example, the step S110 of performing the thermal treatment on the transition metal material 200 at the first temperature $T_1$ in the hydrogen atmosphere may include a thermal treatment step performed at a temperature ranging from about 1000° C. to about 1080° C., but example embodiments of the inventive concepts may not be limited thereto.

In example embodiments, the step S110 of performing the thermal treatment on the transition metal material 200 at the first temperature $T_1$ in the hydrogen atmosphere may include a thermal treatment step performed on the transition metal material 200 for about 1 hour to 2 hours.

For example, the step S110 of performing the thermal treatment on the transition metal material 200 at the first temperature $T_1$ in the hydrogen atmosphere may include a step of thermally treating the transition metal material 200 at a temperature ranging from about 1000° C. to about 1080° C. for about 1 hour, but example embodiments of the inventive concepts may not be limited thereto.

Here, it is unnecessary to perform the thermal treatment step in such a way that the transition metal material 200 is fully liquefied. For example, the thermal treatment step may be performed at a process temperature or process time different from the above value, if such a change is selected to allow the transition metal material 200 to have a soft surface.

Referring to FIG. 5, a thermal treatment may be performed on the transition metal material 200 at the second temperature $T_2$ while halocarbon is additionally supplied onto the transition metal material 200, after performing the thermal treatment on the transition metal material 200 at the first temperature T1 in the hydrogen atmosphere.

Carbon tetrabromide ($CBr_4$) may be used as the halocarbon, as shown in FIG. 5, but example embodiments of the inventive concepts may not be limited thereto. For example, in certain embodiments, various other materials, such as carbon tetrafluoride ($CF_4$) and carbon tetrachloride ($CCl_4$) may be used as the halocarbon.

In example embodiments, the step S120 of thermally treating the transition metal material 200 at the second temperature $T_2$ while additionally supplying the halocarbon thereon may include a step of thermally treating the transition metal material 200 at a temperature lower than a melting point of the transition metal.

For example, the step S120 of thermally treating the transition metal material 200 at the second temperature T2 while additionally supplying the halocarbon thereon a step of thermally treating the transition metal material 200 at a temperature ranging from 400° C. to 1000° C., but example embodiments of the inventive concepts may not be limited thereto.

In example embodiments, the step S120 of thermally treating the transition metal material 200 at the second temperature $T_2$ while additionally supplying the halocarbon thereon may include a step of thermally treating the transition metal material 200 for 15 seconds to 2 minutes.

The longer the process time of the thermal treatment performed at the second temperature $T_2$, the more the halocarbon functional group of the halogen-functionalized carbon material. Further, the longer the process time of the thermal treatment performed at the second temperature $T_2$, the thicker the halogen-functionalized carbon material.

According to example embodiments of the inventive concept, during the synthesis process of the halogen-functionalized carbon material, the process time of the thermal treatment performed at the second temperature $T_2$ may be changed to control content of the functional group contained in the halogen-functionalized carbon material and a thickness of the halogen-functionalized carbon material.

In example embodiments, the step S120 of thermally treating the transition metal material 200 at the second temperature $T_2$ while additionally supplying the halocarbon thereon may include a step of supplying the halocarbon onto the transition metal material 200 at a partial pressure of from 1 to 20 mTorr.

The higher of the partial pressure of the halocarbon to be supplied into the chamber 20, the higher a concentration of the halocarbon functional group contained in the halogen-functionalized carbon material. Further, the higher of the partial pressure of the halocarbon to be supplied into the chamber 20, the thicker the halogen-functionalized carbon material.

According to example embodiments of the inventive concept, during the synthesis process of the halogen-functionalized carbon material, the partial pressure of the halocarbon may be changed to control content of the functional group contained in the halogen-functionalized carbon material and a thickness of the halogen-functionalized carbon material.

Referring back to FIG. 1, the method for synthesizing a halogen-functionalized carbon material 100 may further include a step S130 of cooling the transition metal material 200 in an inert atmosphere, which may be performed after the step S120 of thermally treating the transition metal material 200 at the second temperature T2 while additionally supplying the halocarbon thereon.

For example, as shown in FIG. 6, the transition metal material 200 may be quenched in an argon atmosphere, after growing the halogen-functionalized carbon material (for example, by additionally supplying the halocarbon on the transition metal material 200 at the second temperature $T_2$). The quenching of the transition metal material 200 may be performed under the atmospheric pressure.

Figure 7:
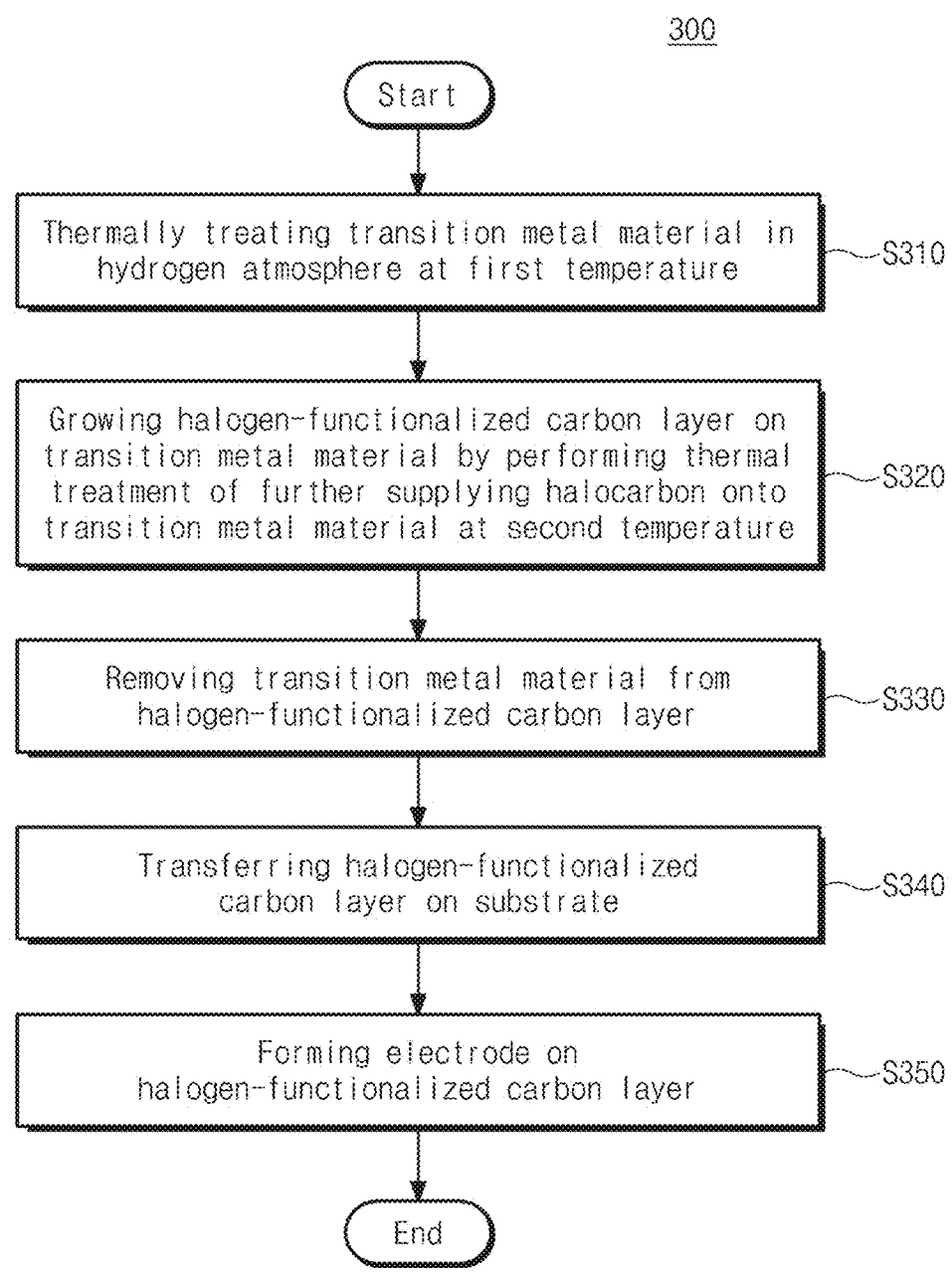
FIG. 7 is a flow chart exemplarily illustrating a method of fabricating an electronic device according to example embodiments of the inventive concept.
Figure 8:
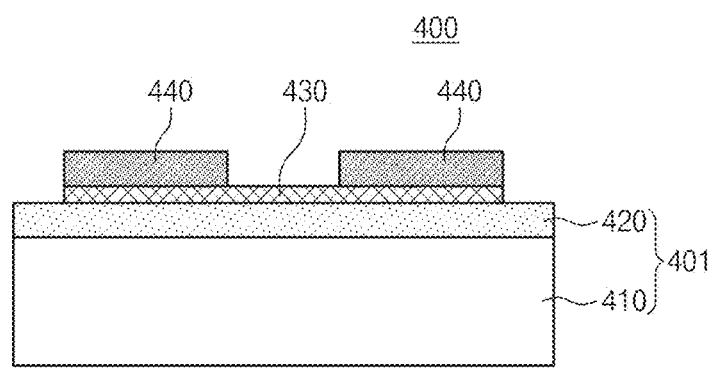
FIG. 8 is a sectional view illustrating an example of an electronic device, which is fabricated by a fabrication process according to example embodiments of the inventive concept.

FIG. 7 is a flow chart exemplarily illustrating a method 300 of fabricating an electronic device according to example embodiments of the inventive concept, and FIG. 8 is a sectional view illustrating an example of an electronic device 400, which is fabricated by a fabrication process according to example embodiments of the inventive concept.

Referring to FIGS. 7 and 8, a method 300 of fabricating an electronic device may include a step S310 of thermally treating the transition metal material 200 in a hydrogen atmosphere at a first temperature $T_1$, a step S320 of growing a halogen-functionalized carbon layer 430 on the transition metal material 200 by performing a thermal treatment of additionally supplying halocarbon onto the transition metal material 200 at a second temperature $T_2$, which is lower than or equal to the first temperature $T_1$, a step S330 of removing the transition metal material 200 from the halogen-functionalized carbon layer 430, a step S340 of transferring the halogen-functionalized carbon layer 430 on a substrate 401, and a step S350 of forming an electrode 440 on the halogen-functionalized carbon layer 430.

In the fabrication method 300, the device 400 may be fabricated using the method 100 for synthesizing a halogen-functionalized carbon material. In other words, the steps S310 and S320 of the fabrication method 300 may be performed in substantially the same manner as the steps S110 and S120 of the method 100 for synthesizing a halogen-functionalized carbon material.

In example embodiments, a step of quenching the transition metal material 200 in an inert atmosphere may be further performed, after the step S320 of growing the halogen-functionalized carbon layer 430 on the transition metal material 200. The quenching step may be performed in substantially the same manner as the step S130 of the method 100 for synthesizing a halogen-functionalized carbon material.

In example embodiments, the step S330 of removing the transition metal material 200 from the halogen-functionalized carbon layer 430 may include a step of etching the transition metal material 200 on which the halogen-functionalized carbon layer 430 is grown.

For example, the step S330 of removing the transition metal material 200 from the halogen-functionalized carbon layer 430 may include dipping the transition metal material 200 provided with the halogen-functionalized carbon layer 430 in etching solution to etch the transition metal material 200, but the method of etching the transition metal material 200 may not be limited to such a dipping method.

In example embodiments, the step S340 of transferring the halogen-functionalized carbon layer 430 onto the substrate 401 may include a step of disposing the halogen-functionalized carbon layer 430, from which the transition metal material 200 is removed, on the substrate 401.

In example embodiments, the substrate 401 may include a gate and an insulating layer formed on the gate.

For example, referring to FIG. 8, the silicon substrate 410 may be doped with boron (B) to have a conductivity type of p+, and in this case, the silicon substrate 410 may be used as a gate. Further, a layer of $SiO_2$ serving as an insulating layer 420 may be grown or deposited on the silicon substrate 410.

In certain embodiments, an electrode serving as the gate may be formed on the silicon substrate 410, instead of doping the silicon substrate 410 with p+ type dopants.

Further, a material possible for the substrate is not limited to the silicon, and for example, in certain embodiments, the substrate may be formed of or include at least one of various materials such as plastic and glass. The insulating layer 420 may also be formed or include any insulating material other than $SiO_2$.

In example embodiments, the step S350 of forming the electrode 440 on the halogen-functionalized carbon layer 430 may include a step of forming source and drain electrodes on both edges of the halogen-functionalized carbon layer 430. In this case, the electronic device 400 may be a field effect transistor (FET), in which the halogen-functionalized carbon layer 430 is used as a channel layer.

However, there is no need to apply the fabrication method 300 to a process for forming such an FET. For example, the fabrication method 300 may be applied to fabricate any device (e.g., a two-terminal device) including the halogen-functionalized carbon layer 430.

Several methods for synthesizing the halogen-functionalized carbon material according to example embodiments of the inventive concept will be described in more detail below.

First Embodiments

A copper foil with an area of 2 cm×2 cm and a thickness of 70 μm was used as a catalyst substrate for growing a halogen-functionalized carbon material.

The copper foil was loaded in a chamber, and then, the chamber was decompressed to an internal pressure of 3.5 Torr using a pump.

Thereafter, a temperature of the chamber was heated from the room temperature to 1000° C. for 40 minutes in a furnace, while supplying a hydrogen gas and an argon gas into the chamber at flow rates of 200 sccm and 1000 sccm, respectively. Next, the copper foil was thermally treated for 1 hour in the chamber maintained at the temperature of 1000° C.

Afterwards, a carbon tetrabromide gas was additionally supplied at a pressure of 20 mTorr into the chamber, which was maintained at the temperature of 1000° C., for 2 minutes, thereby growing brominated graphene on the copper foil.

To supply the carbon tetrabromide gas, powder of carbon tetrabromide was laid in a canister, and then, the carbon tetrabromide gas was obtained by heating the canister to a temperature of 60° C. Pressure of the carbon tetrabromide gas was controlled by adjusting a diameter of a needle valve installed on a gas supplying line.

After the thermal treatment, the chamber was cooled to the room temperature under the atmospheric pressure, while an argon gas was supplied at a flow rate of 2000 sccm into the chamber.

Second and Third Embodiments

A brominated graphene was grown on a copper foil by the same process as that in the first embodiments, but in the second and third embodiments, the growing of the brominated graphene was performed during process times of 1 minute and 15 seconds, respectively.

Fourth and Fifth Embodiments

A brominated graphene was grown on a copper foil by the same process as that in the first embodiments, but in the fourth and fifth embodiments, the growing of the brominated graphene was performed in such a way that the carbon tetrabromide gas had partial pressures of 5 mTorr and 1 mTorr, respectively.

Sixth to Eleventh Embodiments

A brominated graphene was grown on a copper foil by the same process as that in the first embodiments, but in the sixth to eleventh embodiments, the thermal treatment, which was performed before the supplying of the carbon tetrabromide gas, was performed at a temperature of 1050° C., the partial pressure of the carbon tetrabromide gas was 1 mTorr, and the growing temperature was 400, 500, 600, 700, 800, and 1000° C., respectively.

Figure 9:
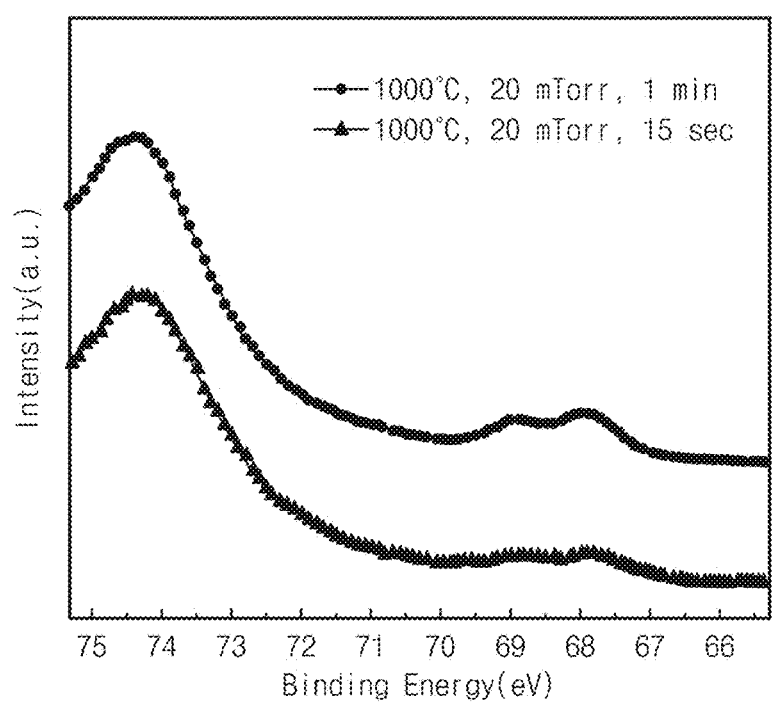
FIG. 9 is a graph showing X-ray photoelectron spectroscope (XPS) spectra of brominated graphene layers, which were formed by synthesis processes according to second and third embodiments of the inventive concept.

FIG. 9 is a graph showing X-ray photoelectron spectroscope (XPS) spectra of brominated graphene layers, which were formed by synthesis processes according to second and third embodiments of the inventive concept.

Referring to FIG. 9, the bromine concentration of the brominated graphene, which was grown for 15 seconds using the method according to the third embodiments, was about 2 at %, and that of the brominated graphene, which was grown for 1 minute by the method according to the second embodiments, was about 4 at %. This result shows that the longer the process time of the growing process, the higher a concentration of the bromine functional group contained in the brominated graphene.

Figure 10:
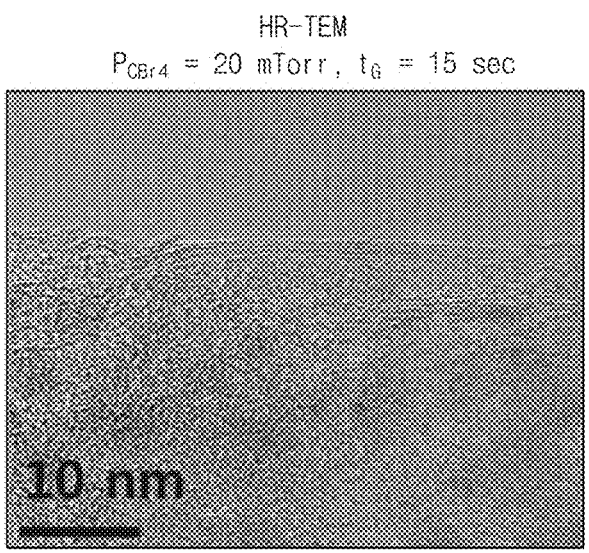
FIGS. 10 and 11 are transmission electron microscope (TEM) images of brominated graphene layers, which were formed by synthesis processes according to a third embodiment of the inventive concept.
Figure 11:
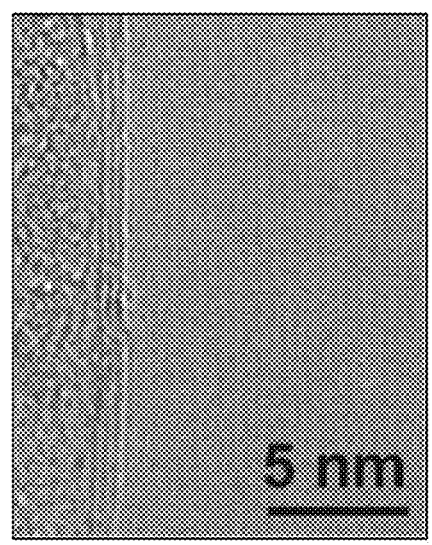
Figure 12:
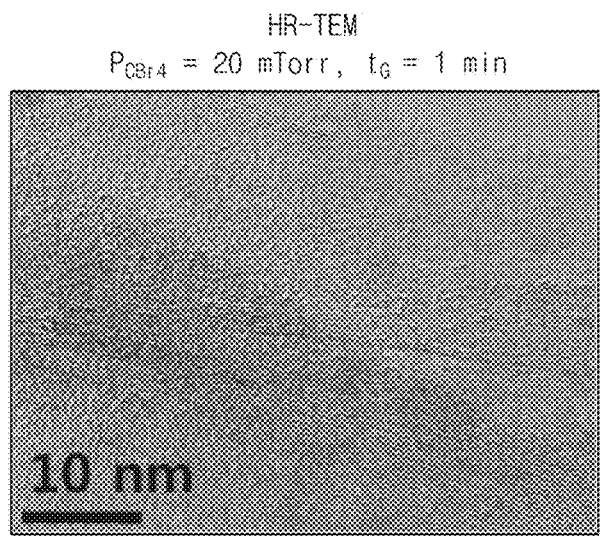
FIGS. 12 and 13 are TEM images of brominated graphene layers, which were formed by synthesis processes according to the second embodiment of the inventive concept.
Figure 13:
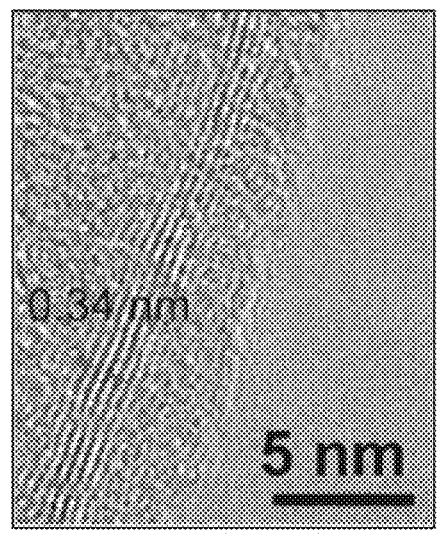

FIGS. 10 and 11 are transmission electron microscope (TEM) images of brominated graphene layers, which were formed by synthesis processes according to a third embodiment of the inventive concept, and FIGS. 12 and 13 are TEM images of brominated graphene layers, which were formed by synthesis processes according to the second embodiment of the inventive concept.

Referring to FIGS. 10 through 13, the brominated graphene, which was grown for 15 seconds by the method according to the third embodiments, was synthesized to have three layers, but the brominated graphene, which was grown for 1 minute by the method according to the second embodiments, was synthesized to have six layers. This result shows that the longer the process time of the growing process, the more the number of the layers constituting the brominated graphene.

Figure 14:
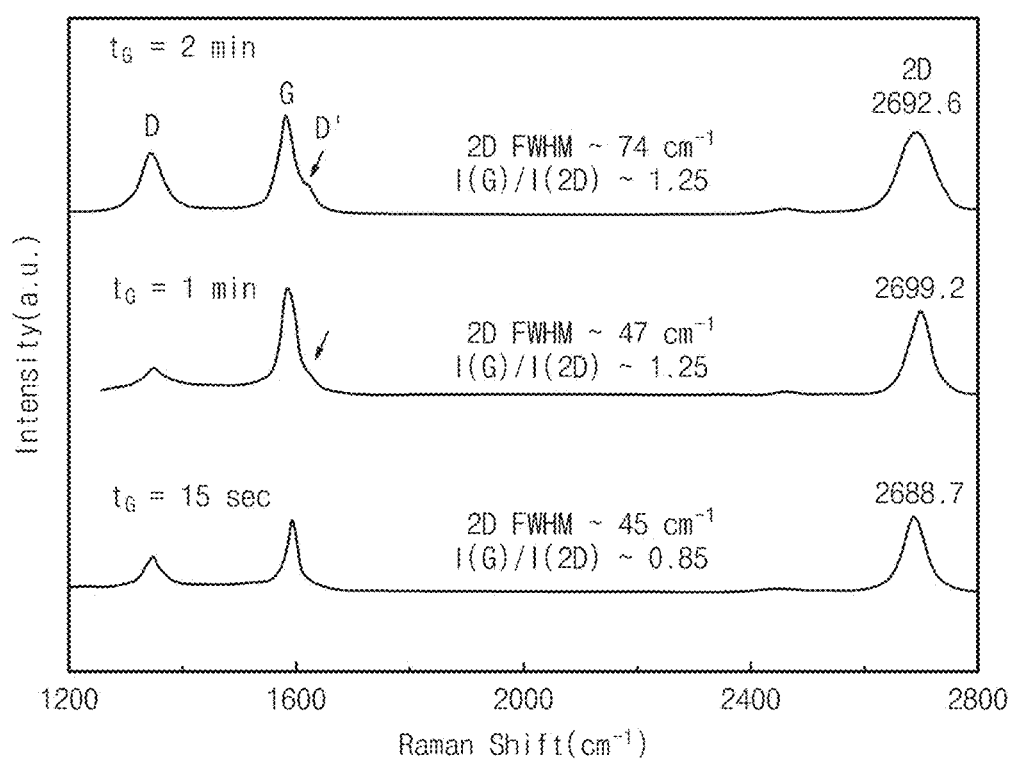
FIG. 14 is a graph showing Raman spectra of brominated graphene layers, which were formed by synthesis processes according to the first to third embodiments of the inventive concept.

FIG. 14 is a graph showing Raman spectra of brominated graphene layers, which were formed by synthesis processes according to the first to third embodiments of the inventive concept.

Referring to FIG. 14, in the case where the growing processes in the third to first embodiments were performed in increasing process times of 15 second, 1 minute, and 2 minutes, the brominated graphene had an increasing thickness.

Figure 15:
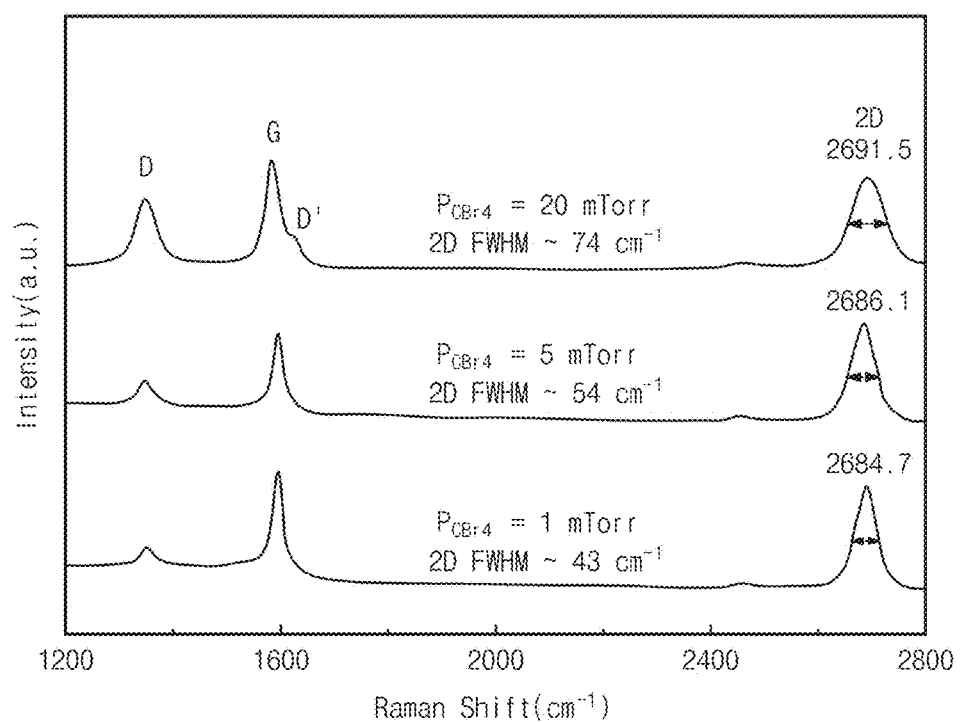
FIG. 15 is a graph showing Raman spectra of brominated graphene layers, which were formed by synthesis processes according to the first, fourth, and fifth embodiments of the inventive concept.

FIG. 15 is a graph showing Raman spectra of brominated graphene layers, which were formed by synthesis processes according to the first, fourth, and fifth embodiments of the inventive concept.

Referring to FIG. 15, in the case where the carbon tetrabromide gas in the fifth, fourth and first embodiments had increasing partial pressures of 1 mTorr, 5 mTorr, and 20 mTorr, the brominated graphene had an increasing thickness.

Figure 16:
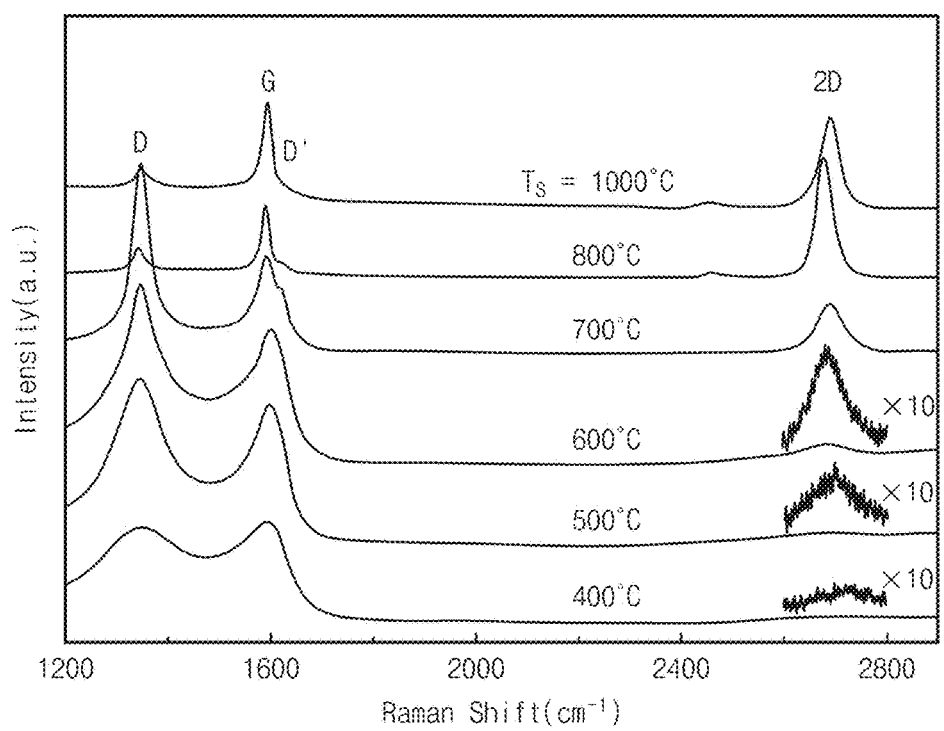
FIG. 16 is a graph showing Raman spectra of brominated graphene layers, which were formed by synthesis processes according to sixth to eleventh embodiments of the inventive concept.

FIG. 16 is a graph showing Raman spectra of brominated graphene layers, which were formed by synthesis processes according to sixth to eleventh embodiments of the inventive concept.

Referring to FIG. 16, in the case where the growing processes in the sixth to eleventh embodiments were performed at increasing process temperatures of 400, 500, 600, 700, 800, and 1000° C., 2D Raman peaks were increased, which means that quality of the brominated graphene is improved.

Hereinafter, an example of a process of fabricating a thin-film transistor using a halogen-functionalized carbon layer will be described.

Brominated graphene was grown on a copper foil using the same process as that described with reference to the eleventh embodiments, poly(methyl methacrylate) (PMMA) was coated on the brominated graphene using a spin coating process.

Thereafter, the copper foil coated with the PMMA was dipped into 0.1 mol ammonium persulfate solution for 12 hours, and as a result, the copper foil was removed.

Next, the brominated graphene, from which the copper foil was removed, was taken out of the ammonium persulfate solution using a glass substrate and was cleaned by dipping it into deionized water.

Thereafter, the cleaned brominated graphene was disposed on a substrate for fabrication of an electronic device. The substrate for the fabrication of the electronic device was prepared by performing a boron doping process to form a silicon substrate having a conductivity type of p++ and then growing a 300 nm layer of $SiO_2$ thereon.

Next, the substrate with the brominated graphene was dried for 2 hours at the room temperature, and the PMMA was dissolved for 3 hours using acetone.

Thereafter, a photoresist was coated on the brominated graphene using a spin coating process, and the substrate was heated to a temperature of 100° C. for 15 seconds using a hot plate.

Next, ultraviolet light was irradiated on the photoresist using a pattern mask, and then, the substrate was dipped into a developing solution to pattern the photoresist.

Thereafter, an oxygen plasma treatment was performed to remove other portion of the graphene, other than the brominated graphene to be used as a channel layer, and a remaining portion of the photoresist was removed using acetone.

Lastly, a 10 nm titanium layer was deposited on the substrate with the channel layer interposed therebetween using a shadow mask, and then, a 50 nm gold layer was deposited to form the source and drain electrodes.

Figure 17:
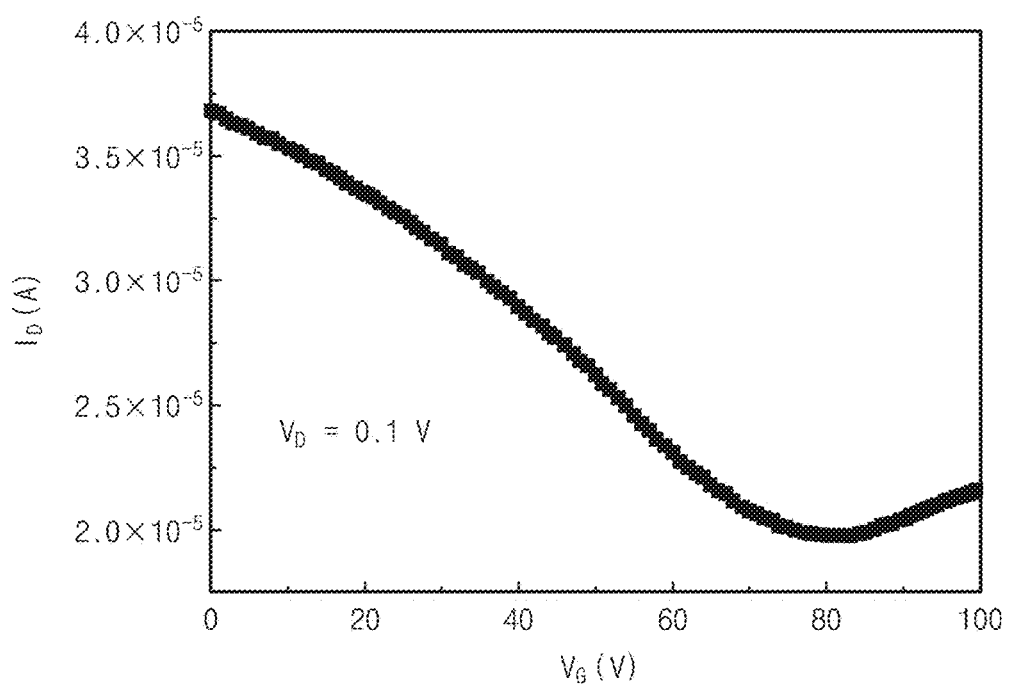
FIG. 17 is a graph showing a Transfer curve of a thin-film transistor manufactured by a fabrication process according to example embodiments of the inventive concept.

FIG. 17 is a graph showing a Transfer curve of a thin-film transistor manufactured by a fabrication process according to example embodiments of the inventive concept.

As shown in FIG. 17, the Transfer curve had a slope of zero, at a gate voltage $V_{Dirac}$ of about 80 V.

According to example embodiments of the inventive concept, it is possible to synthesize a halogen-functionalized carbon material through a single process.

According to example embodiments of the inventive concept, it is possible to reduce a process time required to synthesize a halogen-functionalized carbon material and consequently to improve productivity of the synthesizing process.

According to example embodiments of the inventive concept, it is possible to synthesize a halogen-functionalized carbon material with desired material properties by changing a process condition.

While example embodiments of the inventive concepts have been particularly shown and described, it will be understood by one of ordinary skill in the art that variations in form and detail may be made therein without departing from the spirit and scope of the attached claims.

What is claimed is:

1. A method for synthesizing a halogen-functionalized carbon material, comprising:
    thermally treating a transition metal material at a first temperature in an atmosphere of hydrogen and inert gas; and
    thermally treating the transition metal material at a second temperature, which is lower than or equal to the first temperature, while further supplying halocarbon on the transition metal material to grow a halogen-functionalized carbon layer on the transition metal material as a contiguous process.

2. The method of claim 1, wherein the transition metal material is formed of at least one metallic material selected from the group consisting of copper, nickel, gold, iron, cobalt, platinum, ruthenium, iridium, rhodium, and palladium.

3. The method of claim 1, wherein a chamber, in which the transition metal material is loaded, is maintained to a pressure lower than an atmospheric pressure, during the thermal treating of the transition metal material at the first and second temperatures.

4. The method of claim 3, wherein an inner pressure of the chamber is maintained within a range from 1 Torr to 100 Torr.

5. The method of claim 1, wherein the thermal treating of the transition metal material at the first temperature in the hydrogen atmosphere comprises supplying a hydrogen gas and an inert gas onto the transition metal material.

6. The method of claim 1, wherein the thermal treating of the transition metal material at the first temperature in the hydrogen atmosphere comprises thermally treating the transition metal material to allow a surface of the transition metal material to have fluidity or liquidity.

7. The method of claim 1, wherein the thermal treating of the transition metal material at the first temperature in the hydrogen atmosphere comprises thermally treating the transition metal material at a temperature ranging from 1000° C. to 1080° C.

8. The method of claim 1, wherein the thermal treating of the transition metal material at the second temperature while further supplying halocarbon on the transition metal material comprises thermally treating the transition metal material at a temperature ranging from 400° C. to 1000° C.

9. The method of claim 1, wherein the halocarbon comprises at least one of carbon tetrafluoride (CF4), carbontetrachloride (CCl4), orcarbontetrabromide (CBr4).

10. The method of claim 1, further comprising cooling the transition metal material in an inert atmosphere, after the thermal treating of the transition metal material at the second temperature while further supplying halocarbon on the transition metal material.

11. A method of fabricating an electronic device, comprising
    thermally treating a transition metal material at a first temperature in an atmosphere of hydrogen and inert gas,
    thermally treating the transition metal material at a second temperature lower than or equal to the first temperature, while further supplying halocarbon on the transition metal material, thereby growing a halogen-functionalized carbon layer on the transition metal material as a contiguous process,
    removing the transition metal material from the halogen-functionalized carbon layer,
    transferring the halogen-functionalized carbon layer on a substrate, and
    forming an electrode on the halogen-functionalized carbon layer.

12. The method of claim 11, wherein the transition metal material is formed of at least one metallic material selected from the group consisting of copper, nickel, gold, iron, cobalt, platinum, ruthenium, iridium, rhodium, and palladium.

13. The method of claim 11, wherein a chamber, in which the transition metal material is loaded, is maintained to a pressure lower than an atmospheric pressure, during the thermal treating of the transition metal material at the first temperature and the growing of the halogen-functionalized carbon layer.

14. The method of claim 13, wherein an inner pressure of the chamber is maintained within a range from 1 Torr to 100 Torr.

15. The method of claim 11, wherein the thermal treating of the transition metal material at the first temperature in the hydrogen atmosphere comprises supplying a hydrogen gas and an inert gas onto the transition metal material.

16. The method of claim 11, wherein the thermal treating of the transition metal material at the first temperature in the hydrogen atmosphere comprises thermally treating the transition metal material to allow a surface of the transition metal material to have fluidity or liquidity.

17. The method of claim 11, wherein the thermal treating of the transition metal material at the first temperature in the hydrogen atmosphere comprises thermally treating the transition metal material at a temperature ranging from 1000° C. to 1080° C.

18. The method of claim 11, wherein the growing of the halogen-functionalized carbon layer on the transition metal material comprises thermally treating the transition metal material at a temperature ranging from 400° C. to 1000° C.

19. The method of claim 11, wherein the halocarbon comprises at least one of carbon tetrafluoride (CF4), carbontetrachloride (CCl4), or carbontetrabromide (CBr4).

20. The method of claim 11, further comprising cooling the transition metal material in an inert atmosphere, after the growing of the halogen-functionalized carbon layer on the transition metal material.

* * * * *